(12) United States Patent
Blomberg

(10) Patent No.: US 11,873,558 B2
(45) Date of Patent: Jan. 16, 2024

(54) PRECURSOR CONTAINER

(71) Applicant: Picosun Oy, Espoo (FI)

(72) Inventor: Tom Blomberg, Masala (FI)

(73) Assignee: Picosun Oy, Espoo (FI)

( * ) Notice: Subject to any disclaimer, the term of this patent is extended or adjusted under 35 U.S.C. 154(b) by 0 days.

(21) Appl. No.: 17/903,173

(22) Filed: Sep. 6, 2022

(65) Prior Publication Data

US 2023/0076675 A1 Mar. 9, 2023

(30) Foreign Application Priority Data

Sep. 7, 2021 (FI) ..................................... 20215940

(51) Int. Cl.
*C23C 16/455* (2006.01)
(52) U.S. Cl.
CPC .. *C23C 16/45544* (2013.01); *C23C 16/45512* (2013.01); *C23C 16/45561* (2013.01)
(58) Field of Classification Search
CPC ........ C23C 16/45544; C23C 16/45512; C23C 16/45561; C23C 16/4483; C23C 14/243; C23C 16/4481; Y10T 137/0318; Y10T 137/4891; Y10T 137/7976; Y10T 137/8122; Y10T 137/8622
USPC ........................ 118/723 VE, 726; 156/345.29
See application file for complete search history.

(56) References Cited

U.S. PATENT DOCUMENTS

| | | | |
|---|---|---|---|
| 4,704,988 A | 11/1987 | Mellet | |
| 4,916,828 A | 4/1990 | Yamane et al. | |
| 7,967,911 B2 | 6/2011 | Carlson et al. | |
| 8,313,804 B2 | 11/2012 | Carlson et al. | |
| 10,844,484 B2 | 11/2020 | Jdira et al. | |
| 2008/0173240 A1 | 7/2008 | Furukawahara et al. | |
| 2011/0217224 A1* | 9/2011 | Nishiguchi | ........... C01B 32/956 118/726 |
| 2012/0266967 A1* | 10/2012 | Kanjolia | ............. C23C 16/4481 137/1 |
| 2013/0105483 A1* | 5/2013 | Carlson | ............... C23C 16/4483 220/367.1 |

(Continued)

FOREIGN PATENT DOCUMENTS

| | | |
|---|---|---|
| CN | 1800446 B | 7/2006 |
| CN | 101426953 B | 5/2009 |

(Continued)

OTHER PUBLICATIONS

Finnish Patent and Registration Office, Search Report, U.S. Appl. No. 20/215,940, dated Apr. 7, 2022, 1 page.

(Continued)

*Primary Examiner* — Rudy Zervigon
(74) *Attorney, Agent, or Firm* — Ziegler IP Law Group, LLC

(57) ABSTRACT

Precursor container, comprising a first volume formed by a first chamber to house precursor material, a second volume formed by a second chamber and separated from the first volume by a partition wall, and a conduit passing through the partition wall and extending from the first volume to the second volume providing the precursor material housed within the first volume with a route to the second volume following a pressure increase in the first volume. The partition wall is a gas-permeable wall allowing gas from the first volume to permeate to the second volume.

10 Claims, 3 Drawing Sheets

(56) References Cited

U.S. PATENT DOCUMENTS

| | | |
|---|---|---|
| 2016/0305019 A1 | 10/2016 | Birtcher et al. |
| 2019/0055649 A1 | 2/2019 | Lee et al. |
| 2019/0093221 A1 | 3/2019 | Jdira et al. |
| 2022/0403512 A1* | 12/2022 | White ................ C23C 16/4482 |

FOREIGN PATENT DOCUMENTS

| | | | |
|---|---|---|---|
| CN | 102597310 B | 7/2012 | |
| CN | 108350574 B | 7/2018 | |
| CN | 109545708 A | 3/2019 | |
| CN | 111770900 B | 10/2020 | |
| EP | 3081668 A1 | 10/2016 | |
| JP | S61227834 A | 10/1986 | |
| JP | H0598445 A | 4/1993 | |
| JP | H05214537 A | 8/1993 | |
| JP | 2005033146 A | 2/2005 | |
| JP | 2020076116 A | 5/2020 | |
| KR | 20050107524 | * 11/2006 | .............. B01D 3/22 |
| KR | 20120094004 A | 8/2012 | |
| KR | 20150142158 | * 12/2015 | ......... C23C 16/4482 |
| KR | 20180063242 A | 6/2018 | |
| TW | 200626823 A | 8/2006 | |

OTHER PUBLICATIONS

Finnish Patent and Registration Office, Communication of Acceptance, U.S. Appl. No. 20/215,940, dated Apr. 7, 2022, 4 pages.

Japan Patent Office, Notification of ground of rejection, Application No. 2022-138870, dated Oct. 26, 2022, 3 pages.

Korean Patent Office, Notice of Comment, Application No. 10-2022-0111317, dated Sep. 21, 2022, 4 pages.

International Search Report, Application No. PCT/FI2022/050585, dated Nov. 14, 2022, 6 pages.

Property Bureau of the Ministry of Economic Affairs, Notification letter of review opinion, dated Apr. 12, 2023, Issue No. 11220337650, Republic of China, 8 pages.

Taiwanese Patent Office, Search report, application No. 111131911, dated Apr. 10, 2023; 1 page.

China Patent Office, First Review Notice of Opinion and Search Report, Application No. 2022110731845, dated Aug. 3, 2023, 9 pages.

* cited by examiner

PRECURSOR CONTAINER

FIELD OF THE INVENTION

The present invention generally relates to precursor containers.

BACKGROUND OF THE INVENTION

This section illustrates useful background information without admission of any technique described herein representative of the state of the art.

In CVD (Chemical Vapor Deposition) and ALD (Atomic Layer Deposition) processes a certain minimum amount of reactive gas, precursor, is needed to fill a substrate surface with at least one atomic layer. For ideal ALD processes carried out in optimum temperatures, an excess amount of the precursor does not cause negative effects on a growth rate of a deposited thin film. However, depending on materials to be deposited and the prevailing or requested deposition conditions, an excess amount of precursor chemical may have an effect on the film growth rate. Further some chemicals may be significantly expensive, and using excessive quantities may simply produce unnecessary waste. For CVD, the quantity of precursor may be even more relevant, or for processes which are combinations of ALD and CVD, for example ALD processed without a purge step. When a chemical level changes in a precursor bottle, which will result in an increasing or decreasing volume for the chemical to vaporize in, the dosage per gas pulse will change and thus affect the film growth. Yet further, the addition of inert gas (carrier gas, such as $N_2$ or Ar) can be significant enough to alter pressure, concentration and/or flow speed of the fluids to the extent that will affect the deposition quality. Thus, there is a need for mitigating issues caused by the varying gas volume inside the precursor container, and additionally a need for providing an improvement for gas feed arrangements of ALD/CVD reactors.

SUMMARY

It is an object of certain embodiments of the invention to provide an improved precursor container or at least to provide an alternative solution to existing technology.

According to a first example aspect of the invention there is provided a precursor container, comprising:

a first volume formed by a first chamber to house precursor material;

a second volume formed by a second chamber and separated from the first volume by a partition wall; and a conduit passing through the partition wall and extending from the first volume to the second volume providing the precursor material housed within the first volume with a route to the second volume following a pressure increase in the first volume, and the partition wall being a gas-permeable wall allowing gas from the first volume to permeate to the second volume.

In certain embodiments, the precursor material is liquid precursor material. In certain embodiments, the liquid precursor material is heat sensitive. A heat sensitive precursor material may decompose when stored at elevated temperatures for a prolonged period. In certain embodiments the precursor material may be selected from the group, including but not limited to: metal-organic compounds, organometallic compounds, organic compounds, silanes, polysilanes, substituted silanes, and cyclic silanes.

In certain embodiments, the gas-permeable partition wall is porous and sintered such as a porous sintered aluminum disc.

In certain embodiments, the precursor material occupies the entire first volume. In certain embodiments, the precursor material does not occupy the entire first volume so that the liquid precursor material forms a liquid surface level within the first volume.

In certain embodiments, the conduit extends below a liquid surface level of the precursor material housed in the first volume. In certain embodiments, the conduit is a tube, such as a dip tube. In certain embodiments, the conduit is of stainless steel.

In certain embodiments, the precursor container comprises an inlet arranged or attached to the first volume. In certain embodiments, the inlet comprises a valve. In certain embodiments, inert gas is provided via the inlet to the first volume. In certain embodiments, the inert gas is a carrier gas.

In certain embodiments, the liquid precursor material occupies the entire first chamber, such that the surface level or meniscus of the precursor material is in direct contact with the chamber wall(s). In other embodiments, the liquid precursor does not occupy the entire first chamber such that there is a headspace between the liquid surface level or meniscus of the precursor material and the chamber wall(s). In certain embodiments, the headspace is formed between the liquid surface level or meniscus of the precursor material and the partition wall or conduit of the partition wall.

In certain embodiments, the inert gas is provided below the liquid surface level of the precursor material housed in the first volume. When the inert gas is provided below the surface level of the precursor material, the precursor material bubbles and vaporizes.

In certain embodiments, the inert gas is provided above the liquid surface level of the precursor material housed in the first volume. Due to the provided inert gas to the first volume, pressure in the first volume increases. The pressure pushes at least a part of the precursor material housed in the first volume to the second volume via the conduit. The amount of precursor material being pushed to the second volume may be controlled through the amount of pressure introduced. In certain embodiments, the pressure is regulated through the volume and/or flow rate of the inert (or insert) gas introduced.

In certain embodiments, the first volume is maintained at a first temperature and the second volume at a second temperature.

In certain embodiments, the precursor container comprises at least one heating means arranged to heat the first and/or the second volume to a first and/or second temperature. In certain embodiments, a heating means is arranged to heat the second volume to a second temperature, such that the second temperature is warmer or higher than the first temperature. Heating of the second volume to the second temperature, at the same time as the inert gas flows through the gas-permeable partition wall, following an increase in pressure in the first volume, carrying the liquid precursor material into the second volume, increases the vaporization of the precursor material. The combined action of the higher second temperature in the second volume, and good contact and mixing of the inert gas with the liquid precursor, vaporizes the liquid precursor from the liquid phase into the gas phase.

In certain embodiments, means for increasing the vaporization of the precursor material is arranged or attached to the second volume. In certain embodiments, this means includes at least one of the following: an ultrasound source, an infra-red (IR) source and a microwave source.

In certain embodiments, the precursor container comprises an outlet arranged or attached to the second volume. In certain embodiments, the outlet comprises a valve. In certain embodiments, the mixture of the inert gas and the precursor material is discharged via the outlet from the second volume.

In certain embodiments, the discharged mixture of the inert gas and the precursor material is guided for further use, such as into an ALD, MLD (Molecular Layer Deposition), ALE (Atomic Layer Etching) or CVD process.

In certain embodiments, prior to pulsing (or prior to a precursor material pulsing stage), pressure in the first volume is the same or substantially similar to the pressure in the second volume. Further, in certain embodiments, prior to pulsing, the first temperature and the second temperature are the same or substantially similar.

In certain embodiments, during a pulse (or during a precursor material pulsing stage), inert gas is provided to the first volume resulting in a pressure increase in the first volume, which pressure increase pushes the precursor material through the conduit to the second volume. The second volume is heated to the second temperature which is higher than the first temperature in the first volume at least during a pulse. The provision of heat to the second volume raising the temperature to a second temperature vaporizes the precursor material to be further used. When the pulse ends, the precursor material flows back by gravity from the second volume to the first volume having a first temperature.

In certain embodiments, during pulsing (during a precursor material pulse or pulsing stage), pressure in the first volume is higher than in the second volume and the second temperature in the second volume is higher than the first temperature in the first volume.

In certain embodiments, the inlet and outlet valves comprise a mass flow controller.

In certain embodiments, a first chamber providing the first volume is of stainless steel or other low thermal conductivity material. In certain embodiments, a second chamber providing the second volume is of aluminum or other high thermal conductivity material. Accordingly, in certain embodiments the first and second chamber are of different materials.

In certain embodiments, the precursor container is used in an atomic layer deposition, ALD, apparatus. In this context, the term ALD comprises ALD sub-types, such as MLD (Molecular Layer Deposition), plasma-assisted ALD, for example PEALD (Plasma Enhanced Atomic Layer Deposition), and photon-enhanced Atomic Layer Deposition (known also as flash enhanced ALD). In alternative embodiments, the precursor container is used in a chemical vapor deposition (CVD) apparatus or in an atomic layer etching (ALE) apparatus.

According to a second example aspect of the invention there is provided a method for handling precursor material in a precursor container comprising a first volume formed by a first chamber, a second volume formed by a second chamber, the second volume being separated from the first volume by a gas-permeable partition wall, the method comprising:

increasing the pressure in the first volume to cause precursor material housed within the first volume to extend from the first volume to the second volume along a conduit passing through the partition wall; and providing a gas flow from the first volume to the second volume through the gas-permeable partition wall.

In certain embodiments, the method comprises:
increasing the pressure by passing a flow of inert gas into the first volume via an inlet.

In certain embodiments, the method comprises:
providing inert gas to the first volume during a pulsing stage.

In certain embodiments, the method comprises:
discharging inert gas and precursor material from the second volume via an outlet.

In certain embodiments, the method comprises:
heating the second volume to a temperature which is higher than the temperature in the first volume during a pulsing stage.

In certain embodiments, the method comprises:
increasing vaporization of the precursor material within the second volume with an energy source, such as an ultrasound source, an infra-red (IR) source or a microwave source.

Different non-binding example aspects and embodiments of the present invention have been illustrated in the foregoing. The above embodiments are used merely to explain selected aspects or steps that may be utilized in implementations of the present invention. Some embodiments may be presented only with reference to certain example aspects of the invention. It should be appreciated that corresponding embodiments apply to other example aspects as well. Any appropriate combinations of the embodiments may be formed.

BRIEF DESCRIPTION OF THE DRAWINGS

The invention will now be described, by way of example only, with reference to the accompanying drawings, in which.

DETAILED DESCRIPTION

Figure 1:
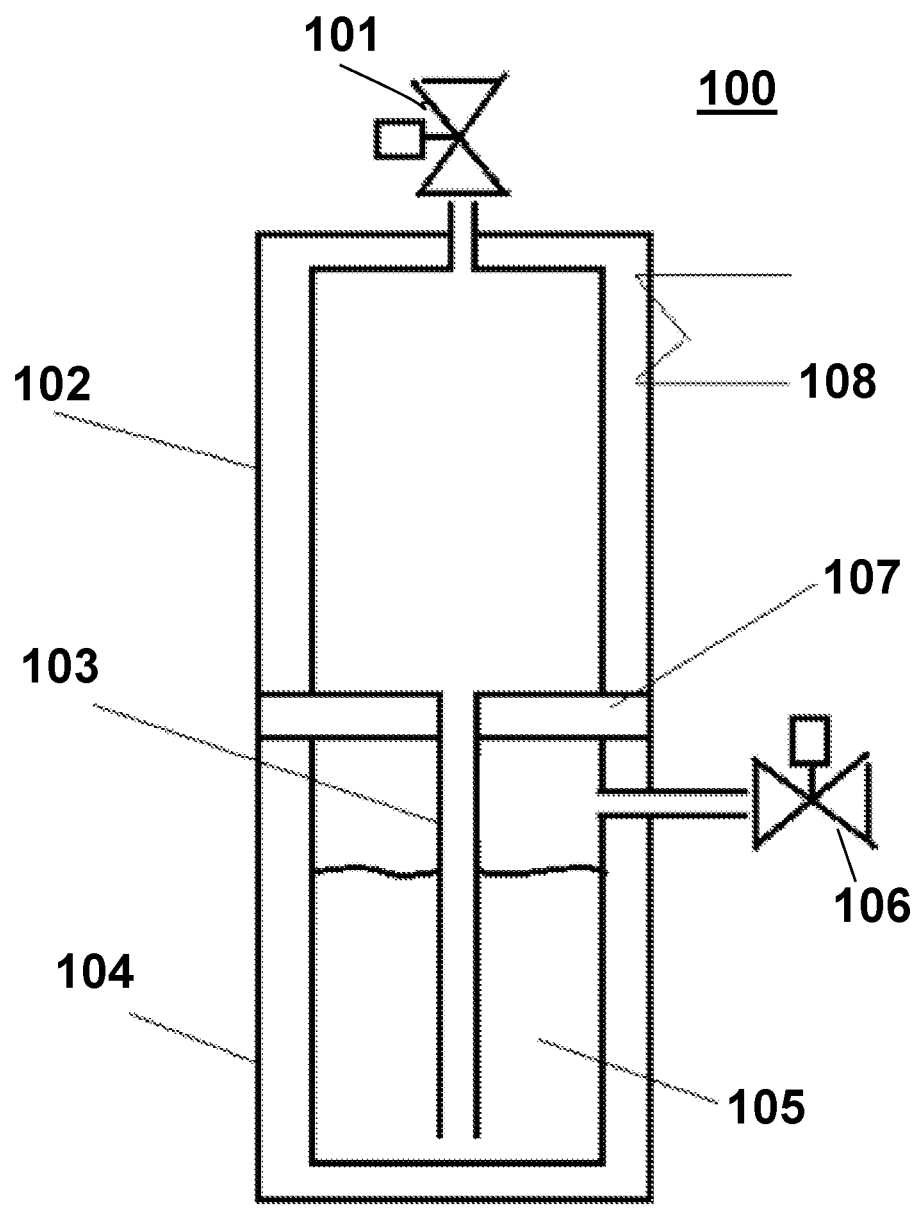
FIG. 1 shows a schematic side view of a precursor container according to an embodiment.

In the following description, Atomic Layer Deposition (ALD) technology and Atomic Layer Etching (ALE) technology are used as an example.

The basics of an ALD growth mechanism are known to a skilled person. ALD is a special chemical deposition method based on sequential introduction of at least two reactive precursor species to at least one substrate. A basic ALD deposition cycle consists of four sequential steps: pulse A, purge A, pulse B and purge B. Pulse A consists of a first precursor vapor and pulse B of another precursor vapor. Inactive gas and a vacuum pump are typically used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be either simpler or more complex. For example, the cycles can include three or more reactant vapor pulses separated by purging steps, or certain purge steps can be omitted. Or, as for plasma-assisted ALD, for example PEALD (plasma-enhanced atomic layer deposition), or for photon-assisted ALD, one or more of the deposition steps can be assisted by providing required additional energy for surface reactions through plasma or photon in-feed, respectively. Or one of the reactive precursors can be substituted by energy, leading to single precursor ALD processes. Accordingly, the pulse and purge sequence may be different depending on each particular case. The deposition cycles form a timed deposition sequence that is controlled by a logic unit or a microprocessor. Thin films grown by ALD are dense, pinhole free and have uniform thickness.

As for substrate processing steps, the at least one substrate is typically exposed to temporally separated precursor pulses in a reaction vessel (or chamber) to deposit material on the substrate surfaces by sequential self-saturating surface reactions. In the context of this application, the term ALD comprises all applicable ALD based techniques and any equivalent or closely related technologies, such as, for example the following ALD sub-types: MLD (Molecular Layer Deposition), plasma-assisted ALD, for example PEALD (Plasma Enhanced Atomic Layer Deposition) and photon-assisted or photon-enhanced Atomic Layer Deposition (known also as flash enhanced ALD or photo-ALD).

However, the invention is not limited to ALD technology, but it can be exploited in a wide variety of substrate processing apparatuses, for example, in Chemical Vapor Deposition (CVD) reactors, or in etching reactors, such as in Atomic Layer Etching (ALE) reactors.

The basics of an ALE etching mechanism are known to a skilled person. ALE is a technique in which material layers are removed from a surface using sequential reaction steps that are self-limiting. A typical ALE etching cycle comprises a modification step to form a reactive layer, and a removal step to take off only the reactive layer. The removal step may comprise using a plasma species, ions in particular, for the layer removal.

FIG. 1 shows a schematic side view of a precursor container according to an example embodiment. The precursor container 100 comprises a first chamber 104 providing a first volume, a second chamber 102 providing a second volume separated from the first volume by a partition wall 107 and a conduit 103 passing through the partition wall 107. The conduit 103 extends from the first volume to the second volume providing the liquid precursor material 105 housed within the first volume with a route to the second volume upon pressure increase, thereby enabling fluid communication for the liquid precursor material between the two volumes, under controlled conditions. The partition wall 107 is a gas-permeable wall allowing gas, including inert gas, from the first volume to pass through to the second volume separated from the first volume by the partition wall 107. In one embodiment, the partition wall 107 is a porous disc, preferably a porous sintered Al disc. The inert gas may act as a carrier gas.

In one embodiment the precursor container 100 further comprises a heater 108 for heating the second volume. In another embodiment the precursor container 100 comprises an inlet comprising a valve 106 arranged to provide carrier gas to the first volume. In one embodiment the precursor container comprises an outlet comprising a valve 101 arranged for providing carrier gas and precursor out from the second volume. The valves 101, 102 may comprise mass flow controllers.

In one embodiment the first chamber 104 is of stainless steel and the second chamber 102 is of aluminum. In another embodiment the conduit 103 is a dip tube, preferably of stainless steel.

Figure 2:
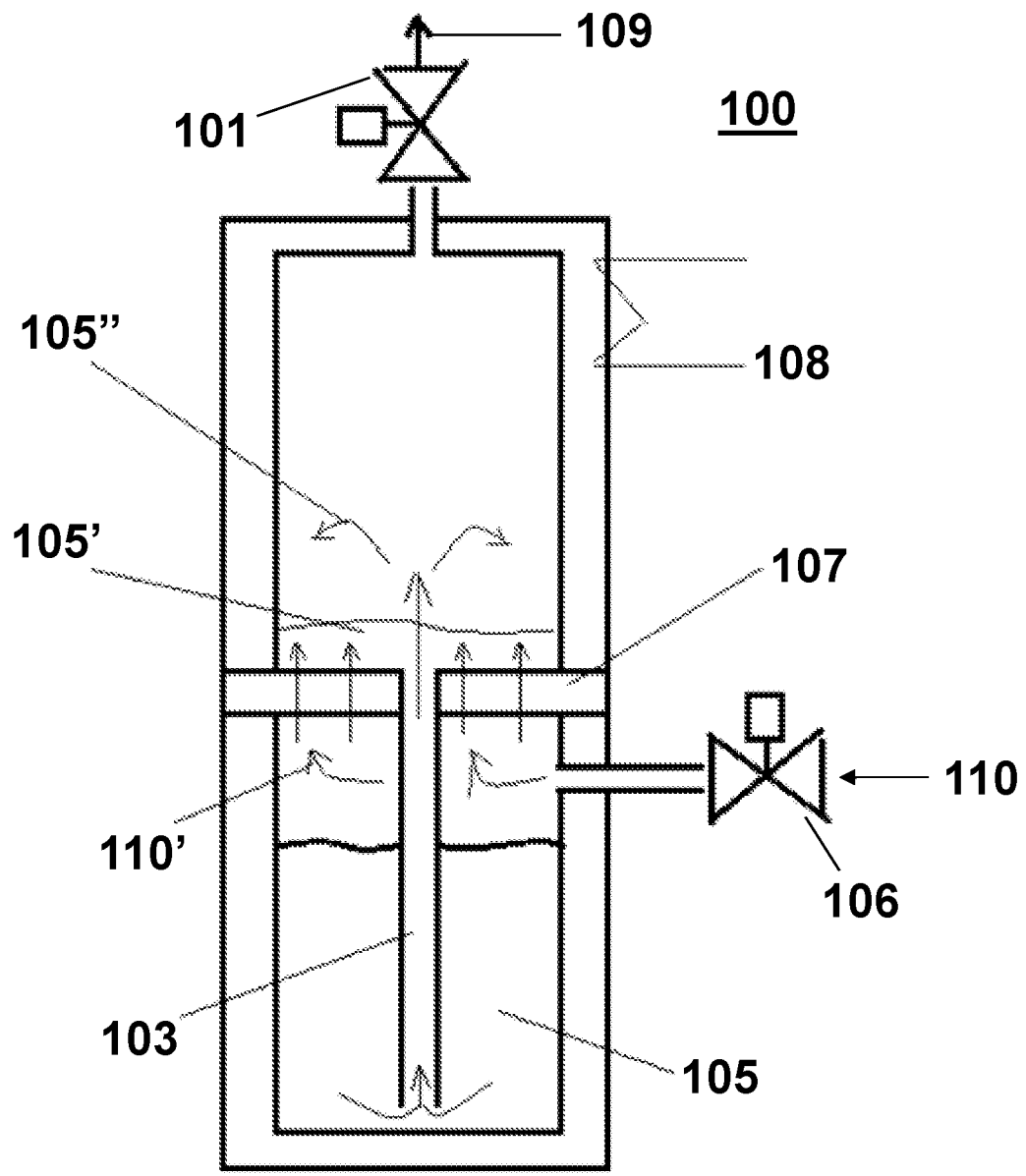
FIG. 2 shows a schematic side view of the precursor container disclosed in FIG. 1 in a pulsing stage according to an embodiment.

FIG. 2 shows a schematic side view of the precursor container of FIG. 1 in use during a precursor material pulsing stage according to an example. The precursor material 105 is stored at a first temperature in the first volume but heated to a second temperature in the second volume during the use (pulsing) of the precursor material. Inert carrier gas 110 is injected to the first volume through an inlet comprising the valve 106 for increasing the pressure in a headspace between the liquid surface level or meniscus of the precursor material 105, preferably liquid precursor material, and the partition wall 107. The pressure pushes precursor material 105 through the conduit 103 to the second volume, such that precursor material 105" is heated to a second and higher temperature with the heater 108. At the same time, the inert carrier gas 110' flows through the partition wall 107 and flows through the precursor 105' and vaporizes it. With combined actions of the higher temperature and contact and mixing of the inert (or insert) carrier gas with the precursor, the precursor is effectively vaporized. The mixture 109 of the insert carrier gas and the vaporized precursor flows through an outlet comprising a valve 101.

When the pulse ends, the precursor material flows back to the first volume by gravity (not shown).

Before a pulse is applied, pressure in the first volume is the same or similar to the pressure in the second volume and the first temperature and the second temperature are the same or similar.

When a pulse is applied, pressure in the first volume is higher than in the second volume and the second temperature in the second volume is higher than the first temperature in the first volume.

Figure 3:
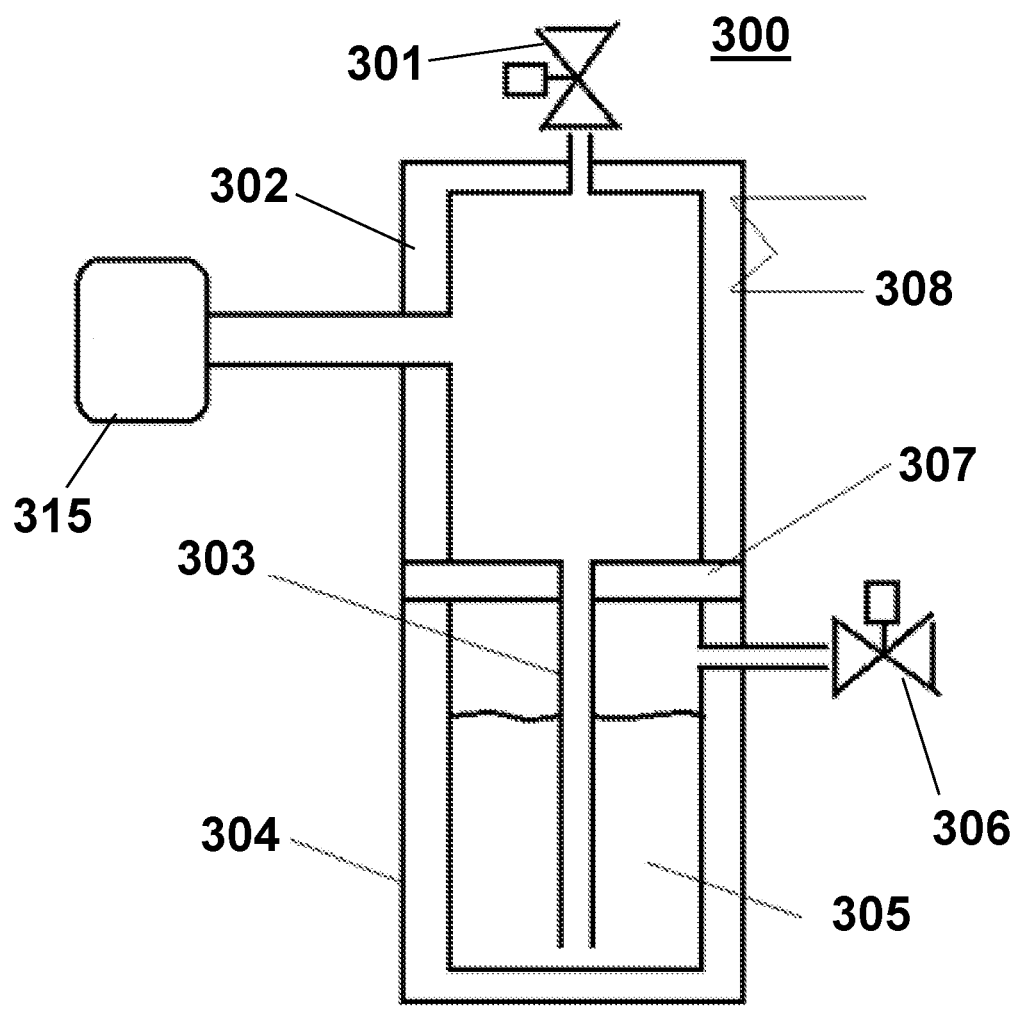
FIG. 3 shows a schematic side view of a precursor container according to certain alternative embodiments.

FIG. 3 shows a schematic side view of a precursor container according to further example embodiments. The precursor container 300 comprises a first chamber 304 providing a first volume, a second chamber 302 providing a second volume separated from the first volume by a partition wall 307 and a conduit 103 passing through the partition wall 107. The conduit 303 extends from the first volume to the second volume providing the precursor material 305 contained by the first volume with a route to the second volume upon pressure increase. The partition wall 307 is a gas-permeable wall allowing gas from the first volume to pass through to the second volume separated from the first volume by the partition wall 307. In one embodiment, the partition wall 307 is a porous disc, preferably a porous sintered Al disc. The precursor container further comprises means 315, such as an ultrasound source, an infra-red (IR) source and/or a microwave source, for increasing the vaporization rate of the precursor in the second volume. In certain embodiments, the means 315 is attached (or arranged) to the second chamber 302.

In certain embodiments, the precursor container 300 further comprises a heater 308 for heating the second volume. In another embodiment the precursor container 300 comprises an inlet comprising a valve 306 arranged to provide carrier gas to the first volume and an outlet comprising a valve 301 arranged for providing carrier gas and precursor out from the second volume. The valves 301, 306 may comprise mass flow controllers.

In certain embodiments, the first chamber 304 is of stainless steel and the second chamber 302 is of aluminum. In certain embodiments, the conduit 303 is a dip tube, preferably of stainless steel.

Without limiting the scope and interpretation of the patent claims, certain technical effects of one or more of the example embodiments disclosed herein are listed in the following. A technical effect is that precursor is effectively vaporized due to combined actions of higher temperature and good contact and mixing of carrier gas with the precursor. A further technical effect is that precursor can be stored at a lower temperature than when vaporized and therefore reducing thermal decomposition of the precursor. The precursor container is compact, simple and safe. A further technical effect is that the precursor container can be used for storage of chemicals that are sensitive to thermal decomposition when placed in a long-term storage. A further technical effect is that this compact solution renders sensitive chemicals stable and safe.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means without deviating from the characteristics of the invention.

Furthermore, some of the features of the above-disclosed embodiments of this invention may be used to advantage without the corresponding use of other features. As such, the foregoing description should be considered as merely illustrative of the principles of the present invention, and not in limitation thereof. Hence, the scope of the invention is only restricted by the appended patent claims.

The invention claimed is:

1. A precursor container, comprising:
a first volume formed by a first chamber to house precursor material;
a second volume formed by a second chamber and separated from the first volume by a partition wall; and
a conduit passing through the partition wall and extending from the first volume to the second volume, wherein the conduit comprises an inlet disposed in the first volume and immersed in the precursor material, below a surface level or meniscus of the precursor material, and an outlet disposed in the second volume, thus providing the precursor material housed within the first volume with a route to the second volume, following a pressure increase in the first volume, and the partition wall being a gas-permeable wall allowing gas from the first volume to permeate to the second volume.

2. The precursor container of claim 1, wherein the precursor container comprises an inlet arranged to the first volume.

3. The precursor container of claim 1, wherein the precursor container comprises an outlet arranged to the second volume.

4. The precursor container of claim 1, wherein the precursor container comprises an inlet arranged to the first volume for providing inert gas to the first volume during a pulsing stage.

5. The precursor container of claim 1, wherein the precursor container comprises an outlet arranged to the second volume for discharging a mixture of inert gas and precursor material from the second volume.

6. The precursor container of claim 2, wherein the inlet or outlet comprises a valve.

7. The precursor container of claim 1, further comprising an attached heating means arranged to heat the second volume.

8. The precursor container of claim 7, wherein the heating means is arranged to heat the second volume to a temperature which is higher than the temperature in the first volume during a pulsing stage.

9. The precursor container of claim 1, wherein first chamber is of material of low thermal conductivity and the second chamber is of material of high thermal conductivity as compared with the material of the first chamber.

10. The precursor container of claim 1, further comprising means for increasing vaporization arranged or attached to the second volume, the means comprising an ultrasound source, an infra-red source or a microwave source.

* * * * *